United States Patent
Yu et al.

(10) Patent No.: US 8,120,377 B2
(45) Date of Patent: Feb. 21, 2012

(54) INTEGRATED CIRCUIT HAVING SECURE ACCESS TO TEST MODES

(75) Inventors: Jianlin Yu, Cupertino, CA (US); Michael Frank, Sunnyvale, CA (US); Erik P. Machnicki, San Jose, CA (US); Jerrold V. Hauck, Windermere, FL (US); Jean-Didier Allegrucci, Sunnyvale, CA (US); Santiago Fernandez-Gomez, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 434 days.

(21) Appl. No.: 12/492,427

(22) Filed: Jun. 26, 2009

(65) Prior Publication Data

US 2010/0333055 A1     Dec. 30, 2010

(51) Int. Cl.
*G01R 31/26* (2006.01)
(52) U.S. Cl. ............................. 324/762.01; 324/750.3
(58) Field of Classification Search .................. None
See application file for complete search history.

(56) References Cited

U.S. PATENT DOCUMENTS

| | | | |
|---|---|---|---|
| 5,742,616 A * | 4/1998 | Torreiter et al. | ............... 714/732 |
| 6,466,048 B1 | 10/2002 | Goodman | |
| 6,664,803 B2 | 12/2003 | Goodman | |
| 7,009,419 B2 | 3/2006 | Goodman | |
| 7,269,529 B2 | 9/2007 | Okabe | |

* cited by examiner

*Primary Examiner* — Minh N Tang
(74) *Attorney, Agent, or Firm* — Lawrence J. Merkel; Meyertons, Hood, Kivlin, Kowert & Goetzel, P.C.; Erik A. Heter

(57) ABSTRACT

Methods for enabling a secure test mode, and integrated circuits (IC's) implementing the same are disclosed. An IC may include a secure functional unit that is protected from access from test access circuitry during normal operation. The secure functional unit may be rendered inaccessible the test access circuitry of the IC following a completion of a test that includes testing of the secure functional unit. An embodiment of an IC that includes circuitry to delay entry into a test mode while a chip-level reset is performed is also contemplated. Entry into the test mode may be delayed until all circuitry of the IC has been fully reset in order to clear stored information.

25 Claims, 6 Drawing Sheets

INTEGRATED CIRCUIT HAVING SECURE ACCESS TO TEST MODES

BACKGROUND

1. Field of the Invention

This invention relates to integrated circuits (IC's), and more particularly, to controlling access to various portions of an IC using design-for-test (DFT) features in an IC.

2. Description of the Related Art

Integrated circuits (IC's) have become increasingly complex as the technology for their design and manufacture has advanced. Due to the increased complexity of IC's, testing to detect manufacturing and design defects has correspondingly increased in importance. However, the increase complexity of modern IC's may make access to certain portions of an IC difficult, if not impossible. Furthermore, some portions (e.g., secure storage, cryptography circuits, etc.) of certain IC's may be designed to be inaccessible from external pins and/or various other functional units.

To overcome the problem of providing full access to the various circuits and functional units of an IC, various design for test (DFT) techniques have been developed. One such technique is to use built-in self-test (BIST) circuitry, in which tests of various circuits may be conducted without outside intervention.

Another technique that may be used is to provide internal scan chains, or using internal scan chains. Each scan chain may include a number of serially coupled scan elements in which test stimulus data may be input into an IC. Tests of the circuitry within the IC may be conducted based on the test stimulus data. After conducting a test using the stimulus data, test result data may be captured in the scan elements and shifted from the IC for further analysis. Using scan chains and other similar techniques may enable access to and testing of portions of an IC that are otherwise inaccessible, including secure circuits not otherwise intended to be accessible through external pins of the IC.

SUMMARY

Methods for enabling a secure test mode and integrated circuits (IC's) implementing the same are disclosed. In one embodiment, the IC may include a secure functional unit that has protected access during normal operation. The secure functional unit may be rendered inaccessible to test circuitry following a completion of testing of the secure functional unit during manufacture of the IC. An embodiment of an IC includes circuitry to delay entry into a test mode while a chip-level reset is performed. Ensuring that a complete chip-level reset occurs prior to entering test mode may ensure that any data from the secure functional unit that may be stored outside of the secure functional unit temporarily (e.g., in a unsecured register) has been erased in the reset.

In one embodiment, an IC may include at least one secure functional unit (e.g., a secure memory/register) coupled to test access circuitry by one or more fuses. Following completion of a test of an IC (including a test of the secure functional unit), the fuses may be blown (i.e. opened). When the fuses are blown, the secure functional unit may no longer be accessible by the test access circuitry. This may prevent an unauthorized access to the secure functional unit, wherein such an unauthorized access might otherwise compromise information (e.g., a cipher key) retained within the secure functional unit.

An embodiment of an IC may also (or alternatively) include reset circuitry, which delays entry into a test mode until a full reset is performed. The reset circuitry may be configured such that a sufficient amount of time has elapsed to allow all circuitry within the IC to be fully reset, and thus any information stored in such circuitry (e.g., in registers) is fully erased before entry into the test mode. The circuitry may accomplish this task by preventing entry into the test mode until a predetermined amount of time (e.g., a certain number of clock cycles) concurrent with a reset operation. The reset circuitry may render the test access circuitry (e.g., scan elements of a scan chain) inaccessible until the predetermined amount of time has elapsed following the initiation of the reset.

BRIEF DESCRIPTION OF THE DRAWINGS

The following detailed description makes reference to the accompanying drawings, which are now briefly described.

Figure 1:
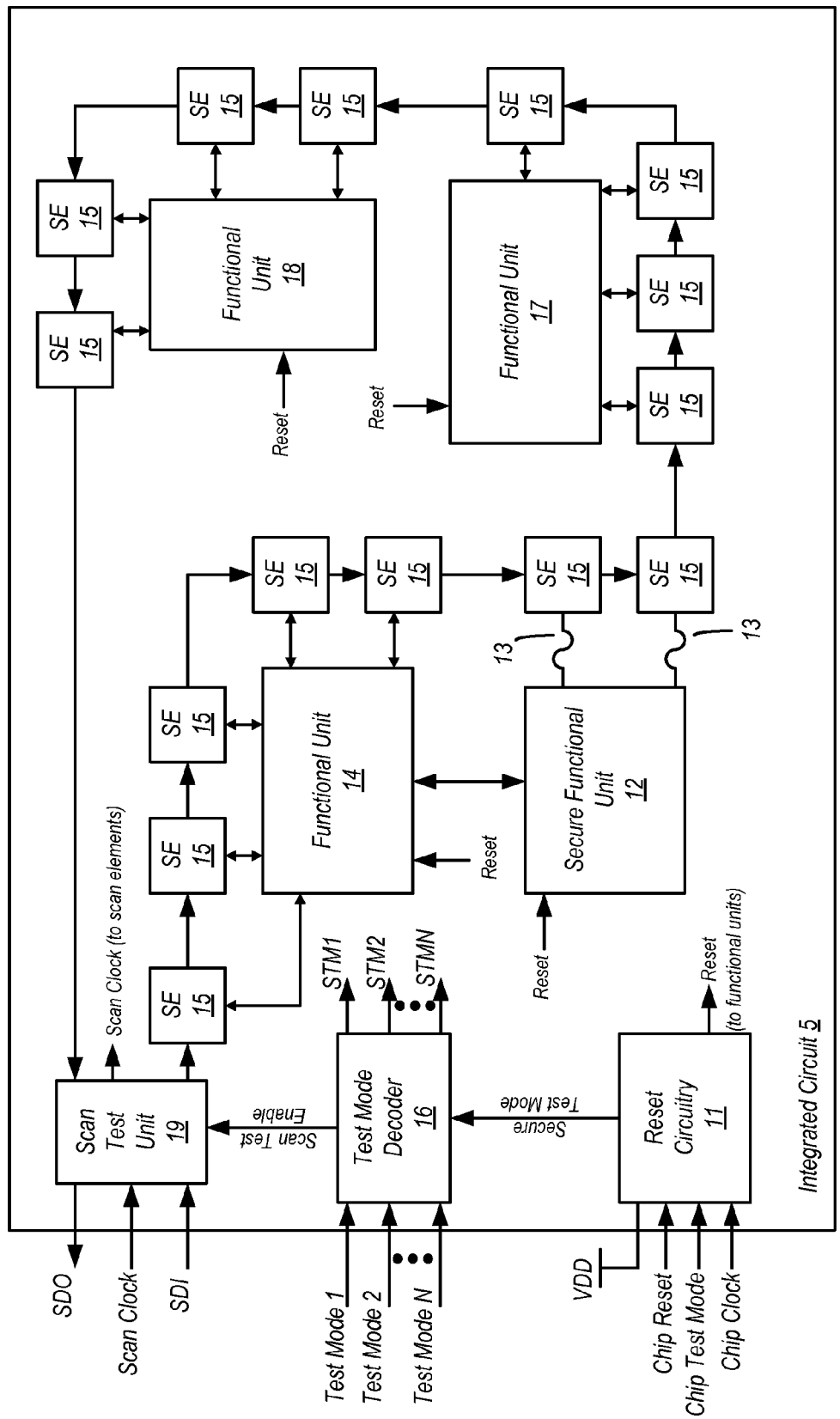
FIG. 1 is a block diagram of an integrated circuit (IC) including test access circuitry and at least one secure functional unit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of an integrated circuit (IC) including test access circuitry and at least one secure functional unit is shown. In the embodiment shown, IC 5 includes functional units 14, 17, 18, and a secure functional unit 12. Each of these functional units may be configured to perform various tasks associated with the operation of IC 5.

For example, in one embodiment, IC 5 may be a processor wherein functional unit 14 is an execution unit, functional unit 17 is a memory controller, and functional unit 18 is a bus interface unit. In another embodiment, IC 5 may be a system on a chip including an execution core, a memory, caches, and various peripherals which may be functional units. In various other embodiments, a greater or lesser number of functional units may be present, and more than one secure functional unit may be present. In general, IC 5 may be virtually any type of IC that includes one or more functional units configured to perform the various intended functions of that IC design.

Although connections are not explicitly shown, functional unit 14 may be coupled to functional unit 17 and/or functional unit 18. Similarly, functional unit 17 may be coupled to functional unit 14 and/or functional unit 18. In general, functional units 14, 17, and 18 may be coupled together in any suitable configuration necessary.

In the embodiment shown, secure functional unit 12 is shown as being coupled to functional unit 14. However, secure functional unit is not, in this embodiment, coupled to functional units 17 or 18. Accordingly, during normal operation of this particular embodiment of IC 5, only functional unit 14 may access secure functional unit 12. This arrangement may be implemented to ensure that secure information (e.g., a cipher key) is not extracted from IC 5 by a hacker or other malevolent party. In general, secure functional unit 12 in this and other embodiments may be intended for restricted access by certain functional units, while being inaccessible by other functional units. Furthermore, in various embodiments, secure functional unit 12 may be intended to be inaccessible from external pins of the IC during normal operation.

In various embodiments, secure functional unit 12 may be a functional unit that is configured to perform various functions wherein information security is required. For example, in one embodiment, secure functional unit 12 may be a cryptography unit, and may thus be configured to encrypt and/or decrypt information sent to or received by IC 5, or transmitted to another functional unit within IC 5. In another embodiment, secure functional unit 12 may be a secure memory or register that is configured to store secure information, such as a cipher key, secure personal information, and/or any other type of information that is intended to be kept secure and of limited access. In general, secure functional unit 12 may be any type of functional unit configured to handle secure information such that is desirable to limit access thereto.

In the embodiment shown, IC 5 includes test access circuitry that enables the testing of functional units 14, 17, 18 and secure functional unit 12. In this particular embodiment, the test access circuitry is in the form of a plurality of serially coupled scan elements 15 (each of which is labeled here as 'SE 15'). A first scan element 15 in the chain is coupled to receive data from scan test unit 19 in this embodiment. A last scan element 15 in the embodiment shown is coupled to provide data to scan test unit 19. Furthermore, scan test unit 19 may be configured to provide at least one scan clock signal to each of scan elements 15 (individual connections to each of the scan elements 15 are not shown here for the sake of simplicity). The scan chain including scan elements 15 may be one of a number of different scan chains that may be present in IC 5. The number of scan elements 15 in any particular scan chain may vary from one chain to the next, as well as from one embodiment of IC 5 to the next.

It should be noted that the use of a scan chain as shown in this particular embodiment is but one example of test access circuitry that may be used to provide access for testing IC 5. Other types of test access circuitry may include BIST (built-in self-test) controllers, boundary scan chains, and/or any other type of circuitry that may provide the controllability and observability for the intended test(s).

In the embodiment shown, test stimulus data may be input into IC 5 through a scan data input (SDI). The inputting of test stimulus data in this embodiment may include serially shifting test stimulus data into the input labeled 'SDI' and through the scan chain. Each of the scan elements 15 in the embodiment shown is coupled to one of functional units 14, 17, or 18, or secure functional unit 12. After all test stimulus data has been loaded into scan elements 15, it may be applied to its corresponding one of functional units 14, 17, or 18, or secure functional unit 12 in order to conduct the test of IC 5. A clock signal may be applied to each of the functional units in conjunction with the test. After testing is complete, scan elements 15 may be used to capture test result data indicative of the results of the test. The test result data may be extracted from IC 5 (e.g., by an IC test system) by serially shifting this data through the chain of scan elements 15 and from the IC through the output labeled 'SDO' (scan data output). After the test result data has been extracted from IC 5, it may be analyzed to determine whether or not IC 5 passed or failed the test, and/or for any other test metric that may be determined based on the test result data.

As previously noted, each of the scan elements 15 are coupled to one of functional units 14, 17, 18, or secure functional unit 12 in the embodiment shown in FIG. 1. However, where functional units 14, 17, and 18 may be coupled to corresponding ones of the scan elements by a wire connection, secure functional unit 12 in this embodiment is coupled to scan elements 15 through fuses 13. Fuses 13 may provide temporary connections to enable access of secure functional unit 12 by the associated scan elements 15 for the purpose of testing. However, once testing is complete, these connections may be severed by blowing fuses 13. Secure functional unit 12 may be rendered inaccessible by scan elements 15 by blowing fuses 13 following the completion of testing. This may in turn prevent a hacker from accessing secure information from secure functional unit through the scan chain that includes scan elements 15.

In embodiments utilizing other types of test circuitry for testing secure functional unit 12, similar connections may be made using fuses, which may then be blown subsequent to completion of a test. Generally speaking, IC 5 may be an IC including at least one secure functional unit 12 that is coupled to test access circuitry by one or more fuses 13. When the fuses 13 are still intact, the test access circuitry may access secure functional unit 12 for performing test operations. Accessing the secure functional unit 12 may include providing test stimulus data thereto and receiving test result data therefrom. However, once testing has completed (e.g., once a manufacturing test has occurred), fuses 13 may be blown prior to shipping IC 5 to a customer. Thus, following the testing described above, secure functional unit 12 may be rendered inaccessible to any other portion of IC 5 other than that for which access is intended during operation. Thus, in the embodiment shown, secure functional unit 12 may be accessible only by functional unit 14 after testing has been performed, but not accessible by any scan element 15, any other one of functional units 17 or 18, any other unit (e.g., scan test unit 19) of IC 5, or any external pin/connection of IC 5.

It should be noted however that in some embodiments, additional testing of IC 5 may be performed subsequent to the blowing of fuses 13. However, such testing may exclude testing of secure functional unit 12, as the blowing of fuses 13 may have rendered secure functional unit 12 inaccessible. For example, a first test may be conducted which includes testing of secure functional unit 12, after the completion of which fuses 13 may be blown. A second, subsequent test may be conducted that tests one or more of functional units 14, 17, and/or 18.

The act of blowing fuses 13 may be accomplished by one of a number of various methods. In one embodiment, testing of IC 5 that includes testing of secure functional unit 12 may be performed on a die of IC 5 before it is implemented in a package (e.g., placed into a ball grid array package). Thus, if the die of IC 5 is still exposed subsequent to testing, fuses 13 may be blown using lasers or other external means suitable for such an action. In another embodiment, the particular ones of scan elements 15 that are coupled to fuses 13 may be specially configured to blow the fuses 13 upon receiving an indication that testing is complete. Still, in another embodiment, additional circuitry (not shown here) implemented specifically for the purpose of blowing fuses 13 upon completion of testing may be implemented on a die of IC 5. In general, fuses 13 may be blown by any suitable method subsequent to conducting a test of IC 5 that includes testing of secure functional unit 12.

In addition to (or as an alternative to) blowing fuses 13, IC 5 may be configured such that a chip-level reset is performed to clear any information that may be stored in the secure functional unit 12 (or temporarily stored outside of the secure functional unit 12) prior to entry into a test mode. Specific details of various embodiments configured to inhibit the beginning test operations until a full reset is performed will be discussed in further detail below.

Figure 2:
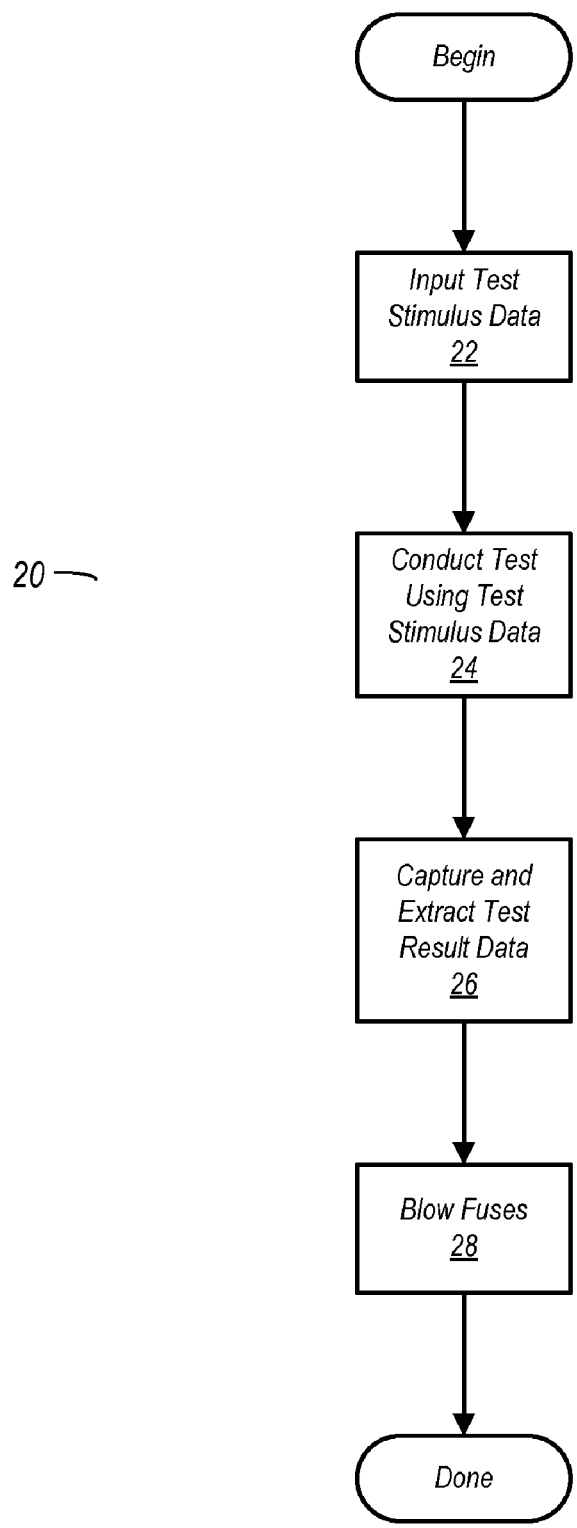
FIG. 2 is a flow diagram of one embodiment of a method of rendering a secure functional unit inaccessible to test access circuitry following completion of a test.

FIG. 2 is a flow diagram of one embodiment of a method of rendering a secure functional unit inaccessible to test access circuitry following completion of a test thereof. In the embodiment shown, method 20 begins with the inputting of test stimulus data (block 22) into an IC. The inputting of test data may be accomplished by various methods based on the particular embodiments. For example, as discussed above with reference to FIG. 1, test stimulus data may be input into IC 5 via the scan chain made up of scan elements 15. In another embodiment of an IC, test stimulus data may be input through structures such as a boundary scan chain, via a BIST controller, or any other suitable means for applying test stimulus data to the circuitry to be tested.

After test stimulus data has been input into the IC, a testing is conducted based on the input stimulus data (block 24). Testing may include testing of a secure functional unit within the IC, such as secure functional unit 12 as discussed above with reference to FIG. 1. After testing has been completed, the test result data may be captured and extracted from the IC (block 26). For example, the embodiment shown in FIG. 1 may capture test result data in scan elements 15 and extract this data by serially shifting it through the scan chain made up of scan elements 15, to the SDO pin, and into a tester or other apparatus that may receive the data.

After the test result data has been extracted, fuses coupling the test access circuitry to the secure functional unit may be blown (block 28). The blowing of the fuses may be conducted following a manufacturing test, and prior to shipping the IC to a customer. Moreover, the blowing of the fuses may be conducted before a die of the IC is placed in a package (e.g., in a ball grid array package) in order to allow external means (e.g., a laser) to blow the fuses. However, other embodiments are also possible and contemplated wherein circuitry is provided on board the IC in order to perform the function of blowing the fuses.

Severing the electrical connection(s) provided by the fuses between the test access circuitry and the secure functional unit may render the secure functional unit inaccessible by the test access circuitry. For example, if fuses 13 shown in FIG. 1 are blown, secure functional unit 12 may no longer be accessible by those scan elements 15 to which fuses 13 are coupled. Moreover, blowing fuses 13 may render secure functional unit 12 inaccessible to external pins coupled to the IC via the test access circuitry, or to any other portion of IC 5 other than functional unit 14. This may in turn render secure functional unit 12 inaccessible to a hacker attempting to obtain secure information therefrom.

Generally speaking, various embodiments of the method described in reference to FIG. 2 may be directed to the testing of an IC having one or more secure functional units that are intended for limited access during normal operation, wherein the limited access may be for the purpose of protecting secure information. Temporary access for the purpose of testing the secure functional unit(s) may be provided via way of test access circuitry coupled to the secure functional unit(s) by temporary electrical connections. After the testing is complete, the temporary access may be removed (e.g., by blowing the fuses as discussed above) in order to render the secure functional unit(s) inaccessible by any portion of the integrated circuit for which access is not intended during normal operation.

Another way of protecting secure information from unauthorized access via test access circuitry may include performing a reset of the IC. The reset of the IC may be intended to clear any information that may be stored in the secure functional unit, and may be further intended to clear information in other circuitry (e.g., non-secure functional units) that could possibly be used to determine, partially or wholly, the contents of information in the secure functional unit(s).

Referring back to FIG. 1, IC 5 includes reset circuitry 11, which may be configured to prevent IC 5 from entering a test mode until a full reset has been performed. In this particular embodiment, reset circuitry 11 is configured to receive a chip reset signal, a chip test mode signal, a chip clock signal, and a hardwired logic 1 (shown here as VDD). Reset circuitry 11 may assert a secure test mode signal responsive to the completion of a sequence initiated by receiving these signals. In addition, a reset signal may be conveyed from reset circuitry 11 to each of functional units 14, 17, and 18 and secure functional unit 12. Reset circuitry 11 may be configured such that the secure test mode signal is not asserted until the reset signal has been applied to each of functional units 14, 17, and 18 and secure functional unit 12 for a duration sufficient to ensure that all resettable circuitry within IC 5 is fully reset.

In the embodiment shown, test mode decoder 16 is coupled to receive the secure test mode signal from reset circuitry 11. Responsive to an assertion of the secure test mode signal, test mode decoder may assert one of signals STM1-STMN to initiate a particular one of a number of different test modes. However, test mode decoder may also be configured such that none of signals STM1-STMN is asserted until the secure test mode signal has been asserted. This may prevent test mode decoder 16 from causing IC 5 to enter a test mode until a full reset has been performed, since reset circuitry 11 in the embodiment shown is configured to hold the secure test mode signal in a de-asserted state until the full reset has been performed.

In this particular embodiment, IC 5 includes a scan test unit 19 coupled to receive a scan test enable signal from test mode decoder 16. Test mode decoder 16 may be configured such that the scan test enable signal is not asserted unless the secure test mode signal is also asserted. Thus, reset circuitry 11, through test mode decoder 16, may prevent the assertion of the scan test enable signal until a full reset of IC 5 has been completed.

Scan test unit 19 may be configured such that no information may be input to IC 5 through the scan data input ('SDI') nor output through the scan data output ('SDO') unless the scan test enable signal is asserted. Furthermore, scan test unit 19 may also be configured such that a scan clock signal input into IC 5 is inhibited from being provided to any of the scan elements 15 unless the scan test enable signal is asserted. In some embodiments, as an alternative to implementing scan test unit 19, the scan enable signal output of test mode decoder 16 may be coupled directly to each of the scan elements 15. However, in such embodiments, the scan enable signal may still be held in a de-asserted state in order to inhibit scan elements 15 from serially shifting data or receiving any data from other circuitry within IC 5, and thus inoperable until a full reset has been completed.

Figure 3:
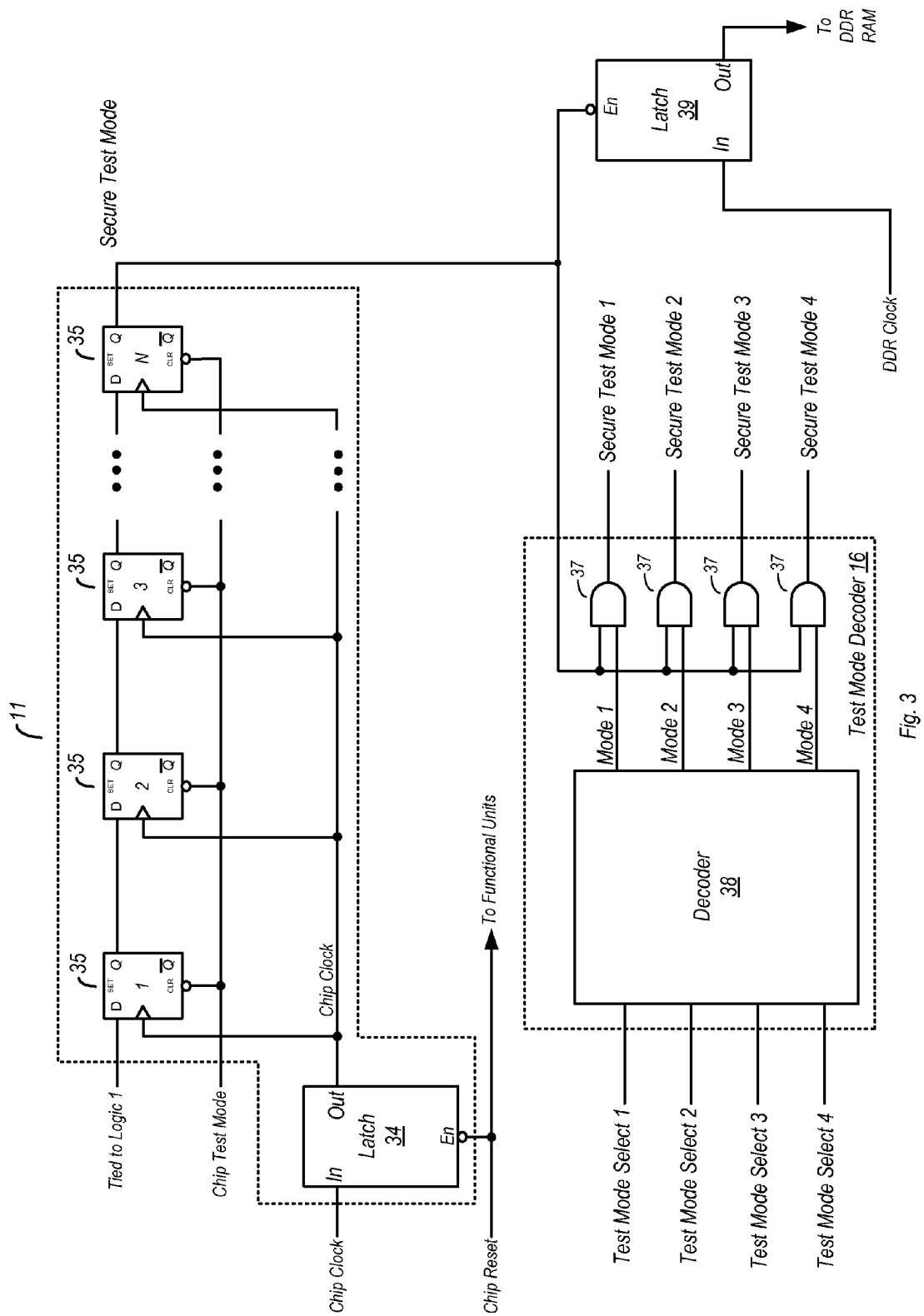
FIG. 3 is a block diagram of one embodiment of reset logic configured to prevent entry into a test mode until a full reset has been performed.

Turning now to FIG. 3, a block diagram of one embodiment of a reset circuit configured to force a reset of an IC prior to entry into a test mode. In the embodiment shown, reset circuit 11 includes a plurality of flip-flops 35 coupled together in a serial configuration. In the embodiment shown, reset circuit 11 includes a total of N flip-flops 35, wherein N can be any suitable number. Specifically, N may be a number of clock cycles greater than or equal to a number of clock cycles that the chip reset is to be asserted to ensure a complete reset of the IC 5 to an initial state. In this particular embodiment, each of flip-flops 35 is a D-flip-flop. Each of flip-flops 35 in the embodiment shown is coupled to receive a chip test mode signal on its reset input. When the chip test mode signal is de-asserted (a logic low, or logic 0 in this case), each of flip-flops may be held in a reset state, which may thus force their respective Q outputs to a logic 0. When the chip test mode signal is asserted (logic high, or logic 1 in this case), flip-flops 35 may operate in accordance with the data received on their respective D inputs and the clock signal received on their respective clock inputs. In the embodiment shown, each flip-flop 35 subsequent to the first has its D input coupled to the Q output of the previous flip-flop 35.

In addition to the chain of serially coupled flip-flops 35, reset circuit 11 in the embodiment shown includes a latch 34 coupled to receive a chip clock signal on its input and a chip reset signal on its enable input. The chip reset signal is asserted low in this particular embodiment to initiate a reset, and may be used to enable latch 34 to propagate signals from its output. Accordingly, the chip clock signal provided to the input of latch 34 may be propagated from the output of latch 34 when the chip reset signal is low. Otherwise, the chip clock signal provided to the input of latch 34 may be inhibited from passing through. In this manner, the flip-flops 35 are only clocked on clock cycles in which the chip reset signal is asserted. When latch 34 is enabled by the logic low assertion of the chip reset signal, the chip clock signal may be propagated from the output of latch 34 to the clock input of each of flip-flops 35. The chip reset signal received by reset circuitry 11 may also be provided to the various functional units of IC 5, or more generally, the particular IC in which reset circuit 11 may be implemented.

Within the serially coupled chain, a D input to a first one of flip-flops 35 in the embodiment shown is tied to a logic 1. This may be accomplished by coupling the D input of the first one of flip-flops 35 to VDD. When the chip reset signal is asserted low, and the chip clock signal propagates from latch 34 to the clock inputs of each of flip-flops 35, each of flip-flops 35 is operable to convey the logic value on its D input to its Q output in synchronization with the chip clock signal. If each flip-flop 35 is in a reset state just prior to beginning operation in the embodiment shown, the Q output of each may thus be a logic 0. Responsive to a first clock cycle, the logic 1 coupled to the D input of the first one of flip-flops 35 may propagate to its Q output. On each of the subsequent clock cycles, the logic 1 may propagate through the serially coupled chain from one flip-flop 35 to the next, until the Q output of the final flip-flop 35 is asserted. The Q output of the final flip-flop 35 in the embodiment shown provides the secure test mode signal when at a logic 1. Thus, the secure test mode signal is asserted in this embodiment when the logic 1 provided to the first flip-flop 35 propagates through the chain to the output of the last flip-flop 35.

Some complex circuits within IC 5 may require more time to fully reset than other circuits. Accordingly, the particular number of flip-flops 35 in various embodiments may be chosen in such a manner to allow sufficient time for all circuits in IC 5 to be fully reset. This may ensure that any information that was previously retained in any of the functional units 14, 17, and 18 may be cleared before allowing access thereto by test access circuitry. Moreover, information stored in or otherwise retained by secure functional unit 12 may also be fully cleared before allowing access to the IC by any test access circuitry (including the chain of scan elements 15). Since there are N flip-flops 35 in this embodiment, a total of N clock cycles may elapse before the secure test mode signal is asserted. The value of N may be chosen in order to allow sufficient time for all circuits in IC 5 to fully reset.

FIG. 3 also illustrates one possible embodiment of a test mode decoder 16 that is configured to utilize the secure test mode signal. In the embodiment shown, test mode decoder includes a decoder 38 coupled to receive a number of different test mode select signals (Test Mode Select 1-4). These test mode select signals may be combined in various ways in order to produce one of a number of different mode signals (Mode 1-4). It should be noted that the number of mode signals and number of test mode signals shown here does not necessarily indicate a one to one correspondence between the two, as the embodiment shown herein is exemplary.

Decoder 38 in the embodiment shown is coupled to provide each of the mode signals to a corresponding one of logic gates 37 (AND gates in this example). Each logic gate 39 is also coupled to receive the secure test mode signal from reset circuit 11. Accordingly, each logic gate 37 is configured to logically combine the secure test mode signal along with its received mode signal in order to produce another secure test mode signal. In the embodiment shown, four logic gates 37 are present and thus four different test modes may be invoke by asserting corresponding one of the secure test mode signals (Secure Test Mode 1-4, which correspond to signals STM 1-4 in FIG. 1, respectively). Assuming that decoder 38 is a one-hot circuit (i.e. only one of the mode signals is asserted at any given time), then only one of the secure test mode signals may be asserted in a particular instance. Furthermore, none of the secure test mode signals may be asserted in this embodiment unless the secure test mode signal provided by reset circuitry 11 is asserted. Accordingly, if the secure test mode signal that is provided by reset circuitry 11 is not asserted, no test mode may be entered regardless of the signal inputs to decoder 38. Furthermore, in some embodiments, if the secure test mode signal provided by reset circuitry 11 is de-asserted at any time subsequent to entering a given test mode, IC 5 may exit that test mode and halt test operations. Re-entry into that test mode may in turn require another reset operation to be performed.

Due to the arrangement of reset circuitry 11 in the embodiment shown, attempts to enter a test mode may force a full reset of IC 5. More particularly, entering a test mode may require various conditions to be met. A first of these conditions in this embodiment is assertion of the chip reset signal at a logic low level. A second one of these conditions in this embodiment is the assertion of the chip test mode signal in order to allow flip-flops 35 to exit their own reset state. A third one of these conditions in this embodiment is the provision of N cycles of the chip clock signal to be provided to each of flip-flops 35. If, during an attempt to enter a test mode, either of the chip reset signal or the chip test mode signal is de-asserted prior to the passing of N clock cycles in the embodiment shown, the test mode may not be entered. Furthermore, if the chip clock signal does not complete at least N cycles in the embodiment shown, the secure test mode signal provided by reset circuitry is not asserted, and thus a test mode is not entered.

Thus, the embodiment of reset circuitry 11 shown in FIG. 3 is arranged such that the chip reset signal is to be held low for at least N cycles of the chip clock signal, without interruption, before IC 5 may enter a test mode. Furthermore, the chip test mode signal is to be held high in the embodiment shown for at least the duration of the N cycles of the chip clock signal, if not throughout the entire test. Any failure to meet at least these conditions in the embodiment shown is sufficient to prevent entry into a test mode, and is further sufficient to require that the reset process by started over from the beginning before any subsequent attempt to enter a test mode may be successful.

In some embodiments, it may be desirable to prevent access to certain information that may be stored in a system memory (e.g., such as a DDR RAM) during test operations. In the embodiment shown in FIG. 3, the secure test mode signal provided by reset circuitry 11 is also provided to latch 39. More particularly, the secure test mode signal is provided to the active low enable (En) input of latch 39 in this example. Latch 39 in this embodiment is further coupled to receive a DDR clock signal, and is configured to convey this clock signal to memory when enabled. Since the enable input is active low in this embodiment, assertion of the secure test mode signal may result in latch 39 effectively blocking the DDR clock signal from propagating to memory, thereby causing the memory to be inaccessible during testing. Accordingly, since the memory may be prevented from receiving a clock signal when the secure test mode signal is asserted, access thereto may be prevented.

It should be noted that the embodiment of reset circuitry 11 shown in FIG. 3 is exemplary, and that other arrangements are possible and contemplated. For example, in some embodiments, latch 34 may be replaced with a passgate, while the chain of serially coupled flip-flops 35 may be replaced with a counter. In general, reset circuitry 11 (as well as the other circuitry shown in FIG. 3) may be implemented using any arrangement that may be used in ensuring that sufficient time to complete a full reset is allowed before entering any test mode.

Figure 4:
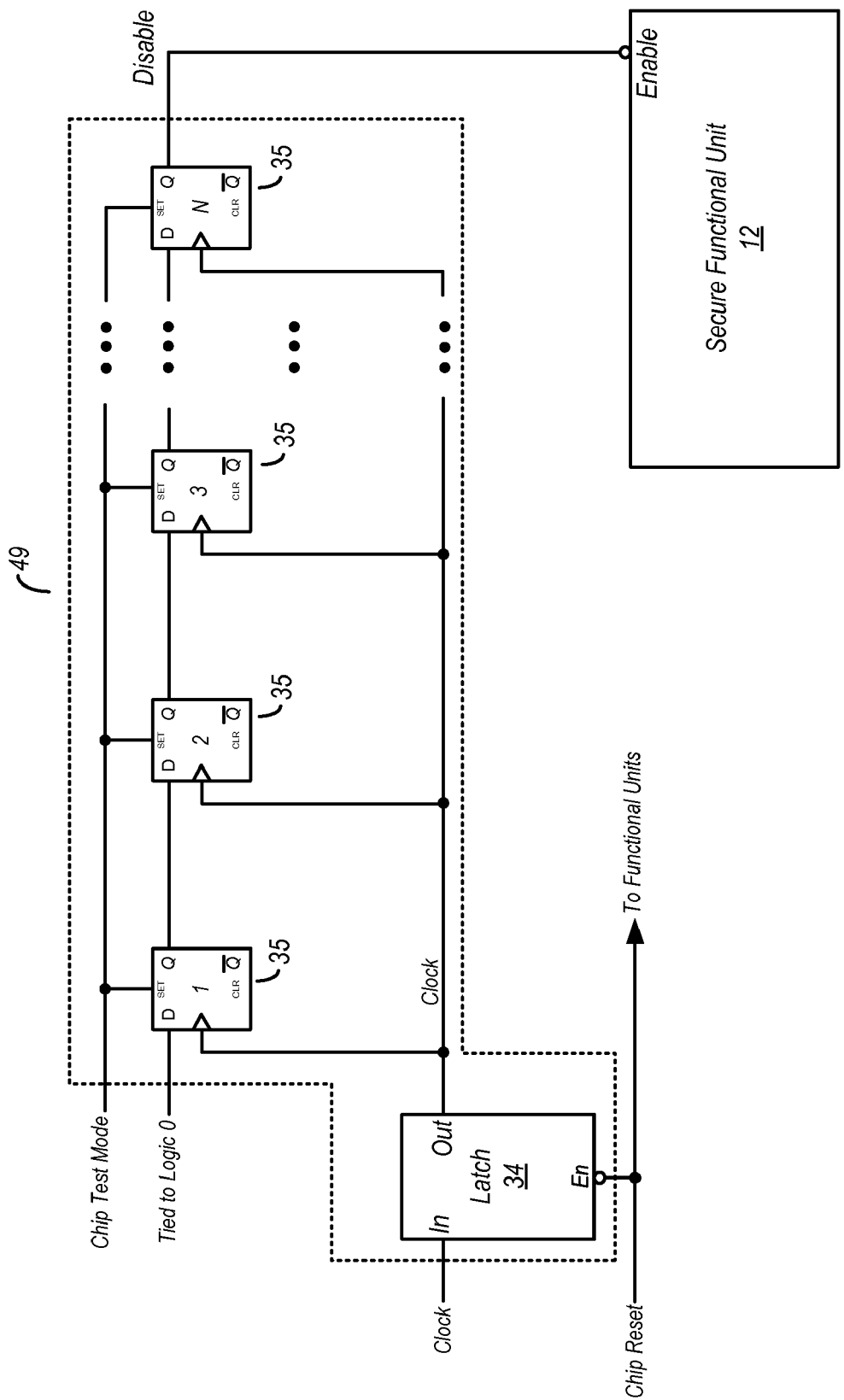
FIG. 4 is a logic diagram of one embodiment for disabling an encryption key unit during testing.

Turning now to FIG. 4, a logic diagram of one embodiment for disabling an encryption key unit during testing is shown. More particularly, FIG. 4 illustrates another mechanism in which testing of an IC (e.g. IC 5 of FIG. 1) may be performed while preventing unauthorized access to secure information. In the embodiment shown, disable circuitry 49 is arranged in a manner similar to reset circuitry 11 of FIG. 3, and thus, some elements thereof are numbered the same.

Disable circuitry 49 in the embodiment shown includes a plurality of flip-flops 35 coupled in series. Each of flip-flops 35 may include a 'set' input, which when a signal is asserted thereon (e.g., when a logic '1' is applied to the input), the 'Q' output transitions high. Thus, the 'Q' output of each flip-flop 35 in this embodiment may become a logic '1' responsive to the assertion of the chip test mode signal. The output of the Nth flip-flop 35 of disable circuitry 39 (labeled 'Disable') may thus be asserted high. In this particular example, the 'Disable' output is coupled to the active-low 'Enable' input of secure functional unit 12.

As noted above, secure functional unit 12 may be one of several types of functional units that stores, processes, or generates secure information that is not intended to be accessible by unauthorized users. For example, secure functional unit 12 may be a cryptography unit that utilized AES GID (Advanced Encryption Standard Global ID) keys for performing encryption and/or decryption of information. Since it may be desirable to keep these keys secure, secure functional unit 12 may be disabled during testing. In this example, the disabling of secure functional unit 12 may be accomplished by asserting the 'Disable' output from disable circuitry 49. Since the 'Disable' signal is asserted high while the 'Enable' input of secure functional unit 12 is active low in this particular embodiment, assertion of the 'Disable' signal may thus inhibit secure functional unit 12 from performing any operations. Furthermore, the disabling of secure functional unit 12 may render it inaccessible by other circuitry in the IC (e.g., IC 5) in which it is implemented.

After testing is complete, the chip test mode signal may be de-asserted. However, in order for secure functional unit 12 to become enabled again, a full chip reset may be asserted. The clock signal provided to the input of latch 34 may be propagated from the output of latch 34 when the chip reset signal is asserted (active low in this example). This clock signal conveyed from the output of latch 34 may be received on a clock input of each of flip-flops 35. In the embodiment shown, the first flip-flop 35 of the serially coupled chain is tied to a logic 0. Thus, the logic 0 may propagate from one flip-flop 35 to the next, eventually reaching the output of the Nth flip-flop 35, which is the 'Disable' output in this embodiment. Accordingly, the 'Disable' output may fall low, thereby asserting the active-low 'Enable' signal provided to secure functional unit 12. This may in turn permit secure functional unit 12 to begin operation. Similar to reset circuitry 11 discussed above, the number of flip-flops 35 ('N') in the serially coupled chain may be chosen such that sufficient time is allowed to elapse to perform a full reset of the chip before the 'Disable' signal is de-asserted (and thus, the 'Enable' signal is asserted).

Figure 5:
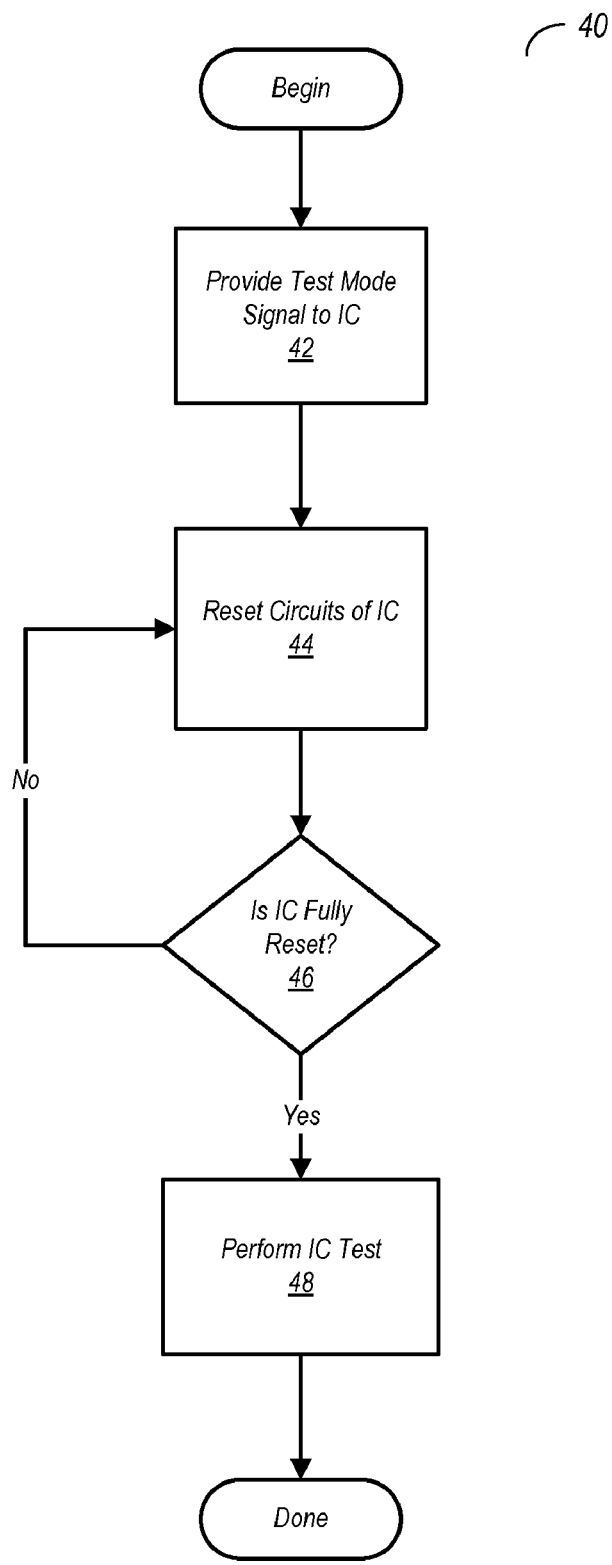
FIG. 5 is a flow diagram of one embodiment of a method of preventing an IC from entering a test mode until a full reset has been performed.

FIG. 5 is a flow diagram of one embodiment of a method of forcing a reset of an IC prior to entering into a test mode. In the embodiment shown, method 40 begins with the provision of a test mode signal to an IC (block 42). The provision of the test mode signal may be indicative of a request to perform a test of the IC. Other signals, such as a chip reset signal, a chip clock signal, and/or a fixed logic value (e.g., as shown in FIG. 1) may also be provided to the IC in conjunction with the test mode signal.

Upon receiving the test mode signal, the IC may then perform a full reset of the circuits therein (block 44). Performing a reset may include clearing any information stored in various storage circuits, including registers, flip-flops, random access memory, and any other internal storage circuits. A reset may also include putting various other types of circuitry in known and predetermined states.

Performing a full reset may require a certain amount of time. Accordingly, if the IC is not fully reset (block 46, no), then the reset operation may continue. As discussed above with reference to FIGS. 1 and 3, a full reset in those embodiments may require N chip clock cycles to elapse before a test mode may be entered, thus providing sufficient time for the reset to fully complete. Generally speaking, circuitry used in performing the method of FIG. 4 may be designed to inhibit any entry into a test mode until a predetermined amount of time has elapsed while a reset is being performed. Accordingly, secure data that may previously have been stored in a secure storage unit or other circuitry may be erased prior to entry into the test mode, thus preventing unauthorized access.

It should also be noted that if the reset operation is interrupted for any reason, it may be required to be restarted from the beginning before entry into a test mode is permitted. For example, consider an IC that includes circuitry configured to prevent entry of a test mode until after N clock cycles have elapsed. If a reset procedure is initiated responsive to a request to enter a test mode, but only N–1 clock cycles complete before the reset is interrupted, a subsequent request enter a test mode may thus require starting again and completing N clock cycles concurrent with a reset before entry into the test mode is permitted.

When the predetermined amount of time has elapsed, thereby indicating that enough time has been allowed for a full reset to complete (block 46, yes), the IC may then enter the test mode and perform the test (block 48). The method thereafter may complete itself. However, if additional testing in another mode is desired, various embodiments of the method may require another reset cycle to be performed prior to entering the next test mode.

It should be noted that embodiments are possible and contemplated wherein both of the general techniques discussed above (blowing fuses and forcing a reset prior to entering a test mode) are utilized. Accordingly, embodiments are possible and contemplated (e.g., such as that shown in FIG. 1) wherein fuses providing access to one or more secure functional units are blown following a test, and yet wherein the secure functional units are nevertheless reset prior to testing. Combining these two techniques may provide an extra level of protection in preventing unauthorized access to secure information. More particularly, performing a full reset of all circuits including a secure functional unit may ensure that information stored therein is removed before it may possibly accessible in the even that a hacker discovers another means of access that was unaccounted for in the design of the IC.

Figure 6:
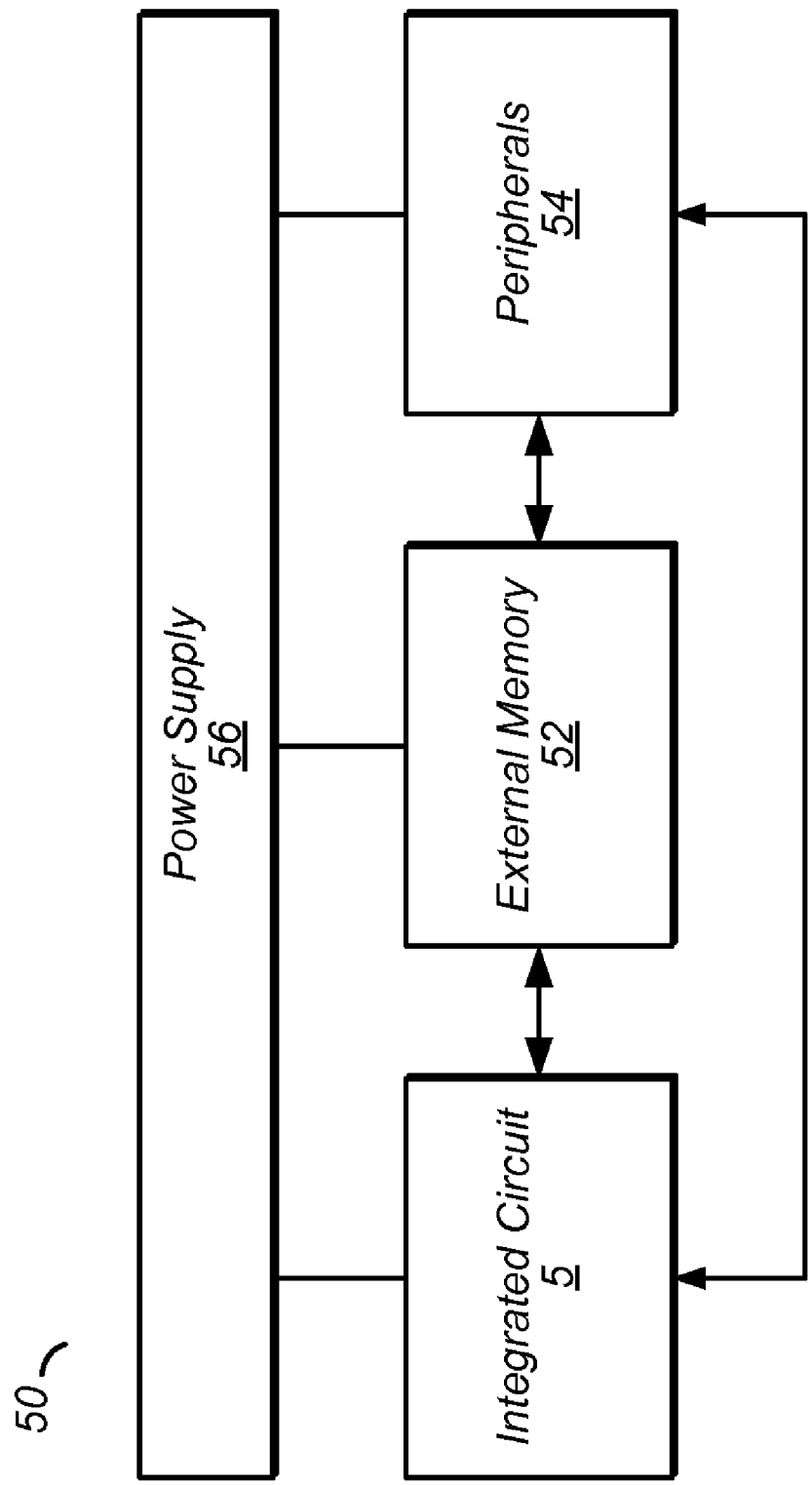
FIG. 6 is a block diagram of one embodiment of a computer system.

Turning next to FIG. 6, a block diagram of one embodiment of a system 50 is shown. In the illustrated embodiment, the system 50 includes at least one instance of an integrated circuit 5 coupled to one or more peripherals 54 and an external memory 52. A power supply 56 is also provided which supplies the supply voltages to the integrated circuit 58 as well as one or more supply voltages to the memory 52 and/or the peripherals 54. In some embodiments, more than one instance of the integrated circuit 5 may be included.

The external memory 52 may be any desired memory. For example, the memory may include dynamic random access memory (DRAM), static RAM (SRAM), flash memory, or combinations thereof The DRAM may include synchronous DRAM (SDRAM), double data rate (DDR) SDRAM, DDR2 SDRAM, DDR3 SDRAM, etc.

The peripherals 54 may include a number of different types of peripheral devices depending on the type of system 50. For example, in one embodiment, the system 50 may be a mobile device and the peripherals 54 may include devices for various types of wireless communication, such as wifi, Bluetooth, cellular, global position system, etc. The peripherals 54 may also include additional storage, including RAM storage, solid-state storage, or disk storage. The peripherals 54 may include user interface devices such as a display screen, including touch display screens or multitouch display screens, keyboard or other keys, microphones, speakers, etc.

It should be noted that while references to particular signal levels and signal assertion levels have been discussed above with reference to the various embodiments disclosed herein, such discussions are intended to be exemplary and are thus not intended to be limiting.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
  a plurality of functional units, wherein at least one of the plurality of functional units is a secure functional unit;
  test access circuitry, wherein the test access circuitry is configured to provide access for testing each of the plurality of functional units; and
  one or more fuses electrically coupling at least a portion of the test access circuitry to the secure functional unit;
  wherein, responsive to completion of a test using the test access circuitry the integrated circuit is configured to, each of the one or more fuses are open and disconnecting the secure functional unit from the test access circuitry, wherein the secure functional unit is inaccessible in test mode subsequent to disconnection from the test access circuitry.

2. The integrated circuit as recited in claim 1, wherein the test access circuitry includes at least one scan chain having a plurality of serially coupled scan elements, wherein at least one of the plurality of scan elements is coupled to the secure functional unit through the one or more fuses.

3. The integrated circuit as recited in claim 1, wherein the secure functional unit is a secure register configured to store secure information.

4. The integrated circuit as recited in claim 1, wherein the secure functional unit is a cryptography unit.

5. An integrated circuit comprising:
  one or more functional units;
  test mode select circuitry, wherein the test mode select circuitry is configured to cause the integrated circuit to enter a selected test mode of one or more test modes responsive to the integrated circuit receiving a test mode signal; and
  reset circuitry, wherein the reset circuitry is configured to cause a reset of circuitry in each of the one or more functional units responsive to the integrated circuit receiving the test mode signal, and wherein the reset circuitry is further configured to inhibit the integrated circuit from entering the selected test mode until the reset is complete.

6. The integrated circuit as recited in claim 5, wherein the reset circuitry is coupled to receive the test mode signal, a chip clock signal, a chip reset signal, and a fixed value logic signal, wherein the reset circuitry includes:
  a latch coupled to receive the chip clock signal on a latch data input and further coupled to receive the chip reset signal on an enable input, wherein the latch is configured to propagate the chip clock signal when the chip reset signal is asserted and further configured to inhibit the chip clock select signal from propagating when the chip reset signal is de-asserted;
  a plurality of serially coupled flip-flops, wherein a data input of a first one of the flip-flops is coupled to receive the fixed logic signal on a respective data input, wherein each of the flip-flops is coupled to receive the test mode signal on respective reset inputs, wherein each of the flip-flops is coupled to receive the chip clock signal from the latch on respective clock inputs, and wherein a last one of the flip-flops is configured to provide a secure test mode signal on a respective data input.

7. The integrated circuit as recited in claim 6, wherein the plurality of serially coupled flip-flops includes N flip-flops, and wherein the last one of the flip-flops is configured to assert the secure test mode signal after N cycles of the chip clock signal, and wherein the integrated circuit is configured to enter the test mode responsive to assertion of the secure test mode signal.

8. The integrated circuit as recited in claim 6, wherein each of the flip-flops is configured to remain in a reset state when the test mode signal is de-asserted.

9. The integrated circuit as recited in claim 5, wherein the reset circuitry is further configured to inhibit a memory clock signal.

10. The integrated circuit as recited in claim 5, wherein the reset circuitry comprises a chain of N clocked storage devices configured to delay an assertion of a test mode signal to the plurality of functional units for N clock cycles in which a chip reset signal is asserted.

11. The integrated circuit as recited in claim 10, wherein N is sufficient to ensure that the integrated circuit is completely reset.

12. An integrated circuit comprising:
  a secure storage unit that is protected from access during normal operation;
  test access circuitry, wherein the test access circuitry is configured to provide access for testing the secure storage unit;

one or more fuses between the test access circuitry to the secure storage unit;

test mode select circuitry, wherein the test mode select circuitry is configured to cause the integrated circuit to enter a selected test mode responsive to the integrated circuit receiving a chip test mode signal;

reset circuitry, wherein the reset circuitry is configured to cause a reset of the integrated circuit responsive to the chip test mode signal, and wherein the reset circuitry is further configured to delay entry into the selected test mode until the reset is complete;

wherein the one or more fuses are blow to disconnect the secure storage unit from the test access circuitry prior to shipping the integrated circuit to a customer.

13. The integrated circuit as recited in claim 12, wherein the test mode select circuit is configured to select the selected test mode from one of one or more test modes responsive to receiving a corresponding test mode select input signal, wherein the test mode select circuitry is coupled to receive a secure test mode signal indicating completion of the reset from the reset circuitry.

14. The integrated circuit as recited in claim 12, wherein the reset circuitry is configured to delay entry into the one of the one or more test modes for N chip clock cycles after the integrated circuit receives the chip test mode signal.

15. The integrated circuit as recited in claim 12, wherein the secure storage unit is a memory configured to store secure data.

16. The integrated circuit as recited in claim 12, wherein the test access circuitry includes at least one scan chain having a plurality of serially coupled scan elements, wherein at least one of the plurality of scan elements is coupled to the secure functional unit through one of the one or more fuses.

17. A method comprising:
inputting, using test access circuitry, test stimulus data into an integrated circuit having a plurality of functional units, wherein at least one of the plurality of functional units is a secure functional unit, wherein the secure functional unit is coupled to at least a portion of the test access circuitry by one or more fuses;

testing the integrated circuit, wherein said testing includes applying the test stimulus data to the secure functional unit;

completing said testing, wherein said completing includes capturing test result data and extracting the test result data from the integrated circuit, wherein said capturing includes capturing test result data from the secure functional unit; and opening the one or more fuses responsive to completing said testing, wherein the secure functional unit is inaccessible in a test mode subsequent to said opening.

18. The method as recited in claim 17, wherein the test access circuitry includes a scan chain having a plurality of serially coupled scan elements, and wherein said inputting include shifting test stimulus data into the integrated circuit through the scan chain.

19. The method as recited in claim 17, wherein said capturing includes capturing test result data into one or more of the plurality of serially coupled scan elements.

20. The method as recited in claim 19, wherein said extracting includes shifting the test result data from the integrated circuit through various ones of the serially coupled scan elements.

21. A method comprising
providing a test mode signal to an integrated circuit, wherein the integrated circuit includes one or more functional units;

resetting circuitry in each of the plurality of functional units responsive to the integrated circuit receiving the test mode signal;

entering a test mode responsive to completing said resetting, wherein said entering is delayed until said resetting is complete, wherein a duration of said resetting comprises a plurality of cycles of a chip clock signal provided to the integrated circuit; and testing the integrated circuit responsive to entering the test mode.

22. The method as recited in claim 21, wherein the method further comprises:
providing the chip clock signal to a data input of a latch;
providing a chip reset signal to an enable input of the latch, wherein the latch is configured to propagate the chip clock signal responsive to receiving the chip reset signal;
providing a fixed logic value to the data input of a flip-flop, wherein the flip-flop is a first one of a plurality of serially coupled flip-flops;
providing the test mode select signal to each of the plurality of serially coupled flip-flops, wherein each of the serially coupled flip-flops is configured to exit a reset mode responsive to receiving the test mode select signal;
providing the clock signal from an output of the latch to a respective clock input of each of the plurality of serially coupled flip-flops;
asserting a secure test mode signal from a last one of the plurality of serially coupled flip-flops after a predetermined number of chip clock cycles; and
entering the test mode responsive to assertion of the secure test mode signal.

23. The method as recited in claim 22, wherein the plurality of serially coupled flip-flops includes N flip-flops, and wherein the predetermined number of chip clock cycles comprises N chip clock cycles.

24. The method as recited in claim 22, further comprising:
de-asserting the test mode select signal responsive to completing said testing, wherein de-asserting the test mode select signal causes each of the plurality of serially coupled flip-flops to enter a reset state.

25. The method as recited in claim 22, further comprising:
de-asserting the chip reset signal; and
inhibiting the chip clock signal from being propagated by the latch responsive to de-asserting the chip reset signal.

* * * * *